(12) United States Patent
Ishigaki et al.

(10) Patent No.: US 8,710,550 B2
(45) Date of Patent: Apr. 29, 2014

(54) SEMICONDUCTOR DEVICE WITH HETERO-JUNCTION BODIES

(71) Applicant: Hitachi, Ltd., Tokyo (JP)

(72) Inventors: Takashi Ishigaki, Tokyo (JP); Ryuta Tsuchiya, Tokyo (JP); Kazuhiro Mochizuki, Tokyo (JP); Akihisa Terano, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/665,194

(22) Filed: Oct. 31, 2012

(65) Prior Publication Data

US 2013/0105812 A1    May 2, 2013

(30) Foreign Application Priority Data

Oct. 31, 2011 (JP) ................. 2011-238406

(51) Int. Cl.
*H01L 29/66* (2006.01)
*H01L 21/02* (2006.01)
*H01L 29/00* (2006.01)

(52) U.S. Cl.
USPC ........... 257/192; 194/280; 194/281; 194/282; 194/283; 194/284; 286/365

(58) Field of Classification Search
USPC .................. 257/192, 194, 280–284, 286, 365
See application file for complete search history.

(56) References Cited

U.S. PATENT DOCUMENTS

| 2004/0058485 | A1* | 3/2004 | Makiyama et al. | 438/182 |
| 2009/0032820 | A1* | 2/2009 | Chen | 257/76 |
| 2009/0267116 | A1* | 10/2009 | Wu et al. | 257/194 |
| 2011/0227132 | A1 | 9/2011 | Anda et al. | |
| 2011/0297961 | A1* | 12/2011 | Bunin et al. | 257/76 |
| 2012/0061680 | A1* | 3/2012 | Lee et al. | 257/76 |

FOREIGN PATENT DOCUMENTS

| JP | 2007-134607 A | 5/2007 |
| JP | 2010-135640 A | 6/2010 |

\* cited by examiner

*Primary Examiner* — Andy Huynh
*Assistant Examiner* — Juanita B Rhodes
(74) *Attorney, Agent, or Firm* — Miles & Stockbridge P.C.

(57) ABSTRACT

A semiconductor device includes a nitride semiconductor stack having at least two hetero junction bodies where a first nitride semiconductor layer and a second nitride semiconductor layer having a band gap wider than that of the first nitride semiconductor layer are disposed, and includes a drain electrode and, a source electrode disposed to the nitride semiconductor stack, and gate electrodes at a position put between the drain electrode and the source electrode and disposed so as to oppose them respectively in which the drain electrode and the source electrode are disposed over the surface or on the lateral side of the nitride semiconductor stack, and the gate electrode has a first gate electrode disposed in the direction of the depth of the nitride semiconductor stack and a second gate electrode disposed in the direction of the depth of the nitride semiconductor at a depth different from the first gate electrode.

11 Claims, 4 Drawing Sheets

SEMICONDUCTOR DEVICE WITH HETERO-JUNCTION BODIES

CLAIM OF PRIORITY

The present application claims priority from Japanese patent application JP 2011-238406 filed on Oct. 31, 2011, the content of which is hereby incorporated by reference into this application.

FIELD OF THE INVENTION

The present invention concerns a semiconductor device and it particularly relates to a technique which is effective when applied to a field effect transistor using a nitride semiconductor.

BACKGROUND OF THE INVENTION

Since group III nitride semiconductors typically represented by gallium nitride (GaN) have a feature that the band gap width is wider and a dielectric breakdown field is higher by about one digit compared with silicon semiconductors, they have been considered promising as power devices in the next generation. Particularly, hetero-junction of the group III nitride semiconductors can generate charges at high concentration (two dimensional electron gases) to the hetero-interface by a polarization effect. The generated two dimensional electron gases suffer from less effect of scattering of ionized impurities and have high mobility. Accordingly, the group III nitride semiconductor can greatly decrease the on resistance that directly results in the loss of power conversion. On the other hand, when a voltage usable in the device is increased, since the running distance of carriers also increases upon turning on of the field effect transistor, the breakdown voltage and the on resistance are in a trade off relation.

Japanese Patent Unexamined Application Publication No. 2007-134607 can be mentioned as the background art of this technical field. The publication describes a rectification diode improved in the trade off between the on resistance and the breakdown voltage by utilizing positive and negative charges generated by polarization. Further, Japanese Patent Unexamined Application Publication No. 2010-135640 describes a field effect transistor in which two polarization junctions are laminated and the on resistance is decreased by two channels.

SUMMARY OF THE INVENTION

In a hetero-junction body using the nitride semiconductor, that is, a field effect transistor in which a plurality of channels formed at the hetero-interfaces are stacked, it is difficult to control the channel on the side remote from the gate electrode at the surface by application of a bias in the prior art. Accordingly, unless a sufficient off bias is applied to the gate, carriers in the remote channel cannot be cut off. That is, this field effect transistor is in an on state when a bias is not applied to the gate, that is, in a normally on state.

In the power devices, normally off, type that remains off when a bias is not applied to the gate is strongly demanded for the sake of safety. Japanese Patent Unexamined Application Publication No. 2010-135640 describes the structure of recessing the surface and embedding a gate therein. In this case, the recess gate cuts off the upper channel and the carriers in the upper channel do not contribute to electric conduction. That is, there is a subject that the on resistance cannot be decreased.

The present invention intends to provide a technique capable of attaining a normally off state and a low on resistance in a nitride semiconductor having a plurality of channels.

The semiconductor device of the present invention has the following main features for attaining the purpose described above.

A semiconductor device including: a nitride semiconductor stack having at least two hetero-junction bodies where a first nitride semiconductor layer and a second nitride semiconductor layer having a band gap wider than the band gap of the first nitride semiconductor layer are stacked, and including: a drain electrode and a source electrode disposed to the nitride semiconductor stack, and gate electrodes at a position put between the drain electrode and the source, electrode and disposed so as to oppose them respectively in which the drain electrode and the source electrode are disposed over the surface or on the lateral side of the, nitride semiconductor stack, and the gate electrode has a first gate electrode disposed in the direction of the depth of the nitride semiconductor stack and a second gate electrode disposed in the direction of the depth of the nitride semiconductor at a depth different from the first gate electrode.

According to the configuration, all of the plurality of channels in the second stack can be cut-off by the first gate electrode disposed at the deep position to attain the normally off state. On the other hand, when the field effect transistor is turned on by a positive bias applied to the gate, the plurality of channels in the nitride semiconductor stack are connected by the second gate electrode, and also the carriers in the plurality of channels can contribute to electric conduction. Accordingly, the on resistance can be decreased.

According to the aspect of the invention, the normally, off state and the low on resistance can be attained in the nitride semiconductor device having a plurality of channels.

DETAILED DESCRIPTION OF THE PREFERRED EMBODIMENTS

Figure 1:
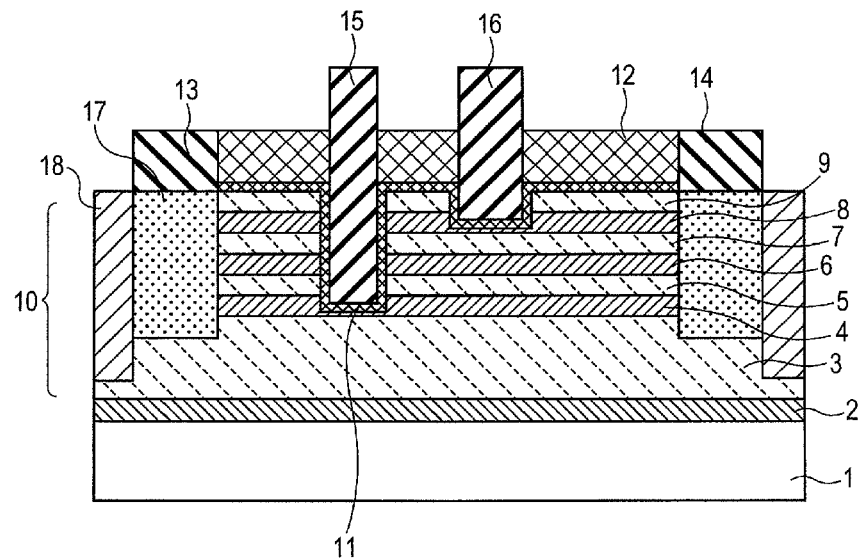
FIG. 1 is an explanatory view showing a cross sectional structure of a semiconductor device of a first embodiment of the invention.

Preferred embodiments of the invention are to be described specifically with reference to the drawings. Throughout the drawings for explaining the preferred embodiments, identical components carry the same reference numerals, in principle, for which duplicate description is to be omitted.

First Embodiment

Figure 2:
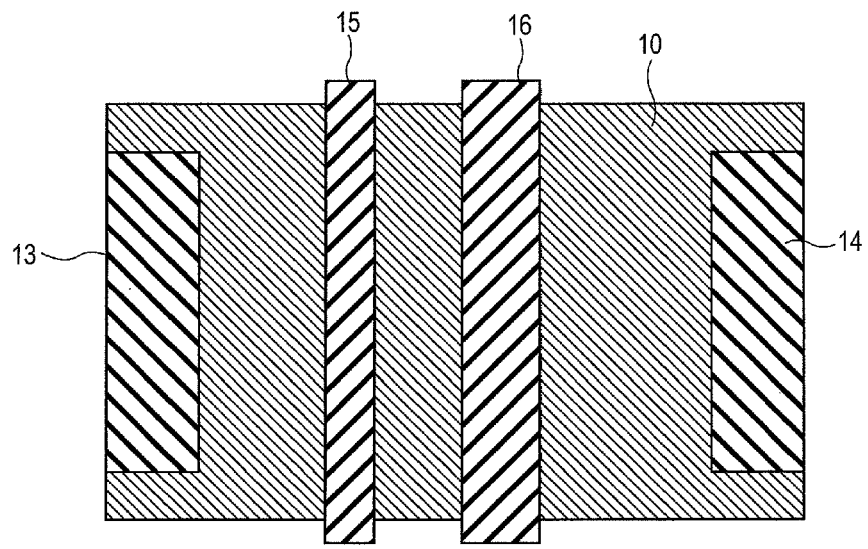
FIG. 2 is an explanatory view showing a planar structure of the semiconductor device of the first embodiment of the invention.

FIG. 1 and FIG. 2 are explanatory views showing a cross sectional structure and a planar structure of a semiconductor of a first embodiment of the invention respectively. While FIG. 1 and FIG. 2 correspond to each other, a device insulation isolation region 18 is not shown in FIG. 2.

A semiconductor device of the first embodiment is a field effect transistor having a buffer layer 2 and a nitride semiconductor stack 10 formed over a semiconductor substrate 1, a region 17 formed in the nitride semiconductor stack 10 in which a first conduction type impurity ($n^+$) is, introduced, a source electrode 13 formed over the n region 17, a drain electrode 14 also formed over the $n^+$ region 17, and gate electrodes 15 and 16 formed by way of an, insulation film 11 in a portion of or over the nitride semiconductor stack 10. In a region necessary for inter-device insulation, a device isolation region 18 is formed and the surface of the device is covered with a protective insulation film 12.

In the field effect transistor, the semiconductor substrate 1 comprises, for example, Si, sapphire, SiC, and GaN.

The buffer layer 2 comprises, for example, a super lattice layer of a thickness of several tens nm or less in which (Al)GaN and AlN are stacked.

The nitride semiconductor stack 10 formed over the buffer layer 2 comprises, for example, nitride semiconductors 3 to 9 in stack. The nitride semiconductor 3 comprises, for example, undoped GaN of a thickness of several µm not intentionally introduced with an impurity, and the nitride semiconductor 4 comprises, for example, $Al_xGa_{1-x}N$ ($0<x\leq1$) of about 25 nm thickness having a wider band gap than the nitride semiconductor 3. The Al compositional ratio x is preferably about 0.25 or less in order to reduce the effect of lattice strains. At the junction interface of the hetero-junction body, charges at about $1\times10^{13}/cm^2$ are generated by polarization.

Further, the nitride semiconductor 4 may also be $In_yAl_{1-y}N$ ($0<y\leq1$). When the In compositional ratio is about 0.18, crystals are grown easily due to lattice matching with GaN. Also in this configuration, charges at high concentration are generated at the hetero-interface by polarization.

The nitride semiconductors 5 and 6, and 7 and 8 also form hetero-junction bodies in which each of the nitride semiconductors 5 and 7 comprises, for example, GaN of small band gap of about 25 nm thickness, and each of the nitride semiconductors 6 and 8 comprises, for example, AlGaN (Al compositional ratio about 0.25) of about 25 nm thickness having a wider band gap than that of the nitride semiconductors 5 and 7. While an example of stacking three sets of nitride semiconductor hetero-junction bodies is shown, at least two sets of hetero-junction bodies may suffice. As the number of the hetero-junction bodies increases, the total amount of charges contributing as the carriers of the field effect transistor increases and the on resistance can be decreased further.

A nitride semiconductor 9, for example, comprising GaN of about 5 nm thickness is preferably formed to the surface of the nitride semiconductor stack 10 for decreasing the effect of the surface state to the carriers.

Manufacturing steps are to be explained successively with reference to FIG. 1.

At first, the buffer layer 2 and the nitride semiconductor stack 10 are formed over the semiconductor substrate 1 by epitaxial growing.

Successively, a not illustrated $SiO_2$ film is deposited and the $SiO_2$ film is fabricated and patterned by photolithography and dry etching. Further, the nitride semiconductor stack 10 is fabricated using the fabricated film as a hard mask by dry etching using chlorine plasma till the etching reaches the nitride semiconductor 3. Carriers are not present in the fabricated region 18, since the hetero-interfaces are eliminated and the region functions as an insulated device isolation region 18.

As another method, after forming a pattern by photolithography, B, Fe, or the like is implanted from the surface of the nitride semiconductor stack 10 so as to reach the, nitride semiconductor 3. The ion implanted region forms the insulated device isolation region 18 in the same manner by the method described above.

Successively, after forming the pattern by photolithography, Si or the like is implanted by ion implantation from the surface of the nitride semiconductor stack 10 so as to reach the nitride semiconductor 3. The region undergoing the ion implantation at a high concentration (for example, $1\times10^{18}/cm^3$ or more) forms a first conduction type ($n^+$) low resistance region 17 by the implanted impurity.

Further, ohmic electrodes (Ti/Al, etc.) are formed over the $n^+$ region 17 by using a sputtering method or a vapor deposition method, and a lift off method. Thus, the source electrode 13 and the drain electrode 14 are formed.

Then, gate regions of the nitride semiconductor stack 10 are fabricated respectively by photolithography and dry etching. In this step, fabrication is performed from the surface of the nitride semiconductor stack 10 to the nitride semiconductor 4 in first gate region and from the surface of the nitride semiconductor stack 10 to the nitride semiconductor 8 in a second gate region. In this step, a set of hetero-junction bodies remain below the first gate region and three sets of hetero-junction bodies remain below the second gate region. The hetero-junction body may not remain below the first gate region and two or more sets of hetero-junction bodies preferably remain below the second gate region.

Successively, a gate insulation film 11 is deposited by using, for example, a sputtering method, a chemical vapor deposition (CVD) method, or an atomic layer deposition (ALD) method. The gate insulation film 11 comprises, for example, an $SiO_2$ film, an SiN film, an $Al_2O_3$ film, an $HfO_2$ film, or a stacked film thereof and is formed to a thickness from several nm to several tens nm.

Further, the gate electrodes 15 and 16 are formed, for example, by photolithography and a lift off method. The gate electrode comprises, for example, Al, Ti/Pt/Au, Ti/Al, TiN/Al, doped poly-Si, or TiN/doped poly-Si. In the metal insulator semiconductor (MIS) structure, a gate current scarcely flows even when a bias is applied to the gate and a high bias can be applied to the gate. Further, a threshold voltage of the field effect transistor can also be controlled depending on the configuration of the gate insulation film.

While an example of forming the gate electrodes 15 and 16 by way of the gate insulation film 11 is shown, the gate electrodes may also be formed not by way of the gate insulation film 11. In this case, the gates are in Schottky contact with the nitride semiconductor stack 10, and the gate electrode comprises, for example, Ni/Au, Pt/Au, and Pd/Au. In the case of the Schottky gate, since a gate current flows when a bias is applied to the gate, high bias cannot be applied to the gate but the manufacturing step is simplified.

Finally, an insulation protective film 12 is deposited to a thickness of about several hundreds nm to several µm using a sputtering method or a CVD method, and not illustrated pad regions for applying a bias from the outside to the respective electrodes are operated to complete the semiconductor device of this embodiment.

As a planar structure, as shown in FIG. 2, the source electrode 13 and the drain electrode 14 are opposed to each other over the nitride semiconductor stack 10 surrounded by the insulated device isolation region 18 (the insulation protective film 12 etc. over the nitride semiconductor stack 10 are not illustrated) and the first gate electrode 15 and the second gate electrode 16 are disposed therebetween till they extend over the insulated device isolation region 18.

Figure 3:
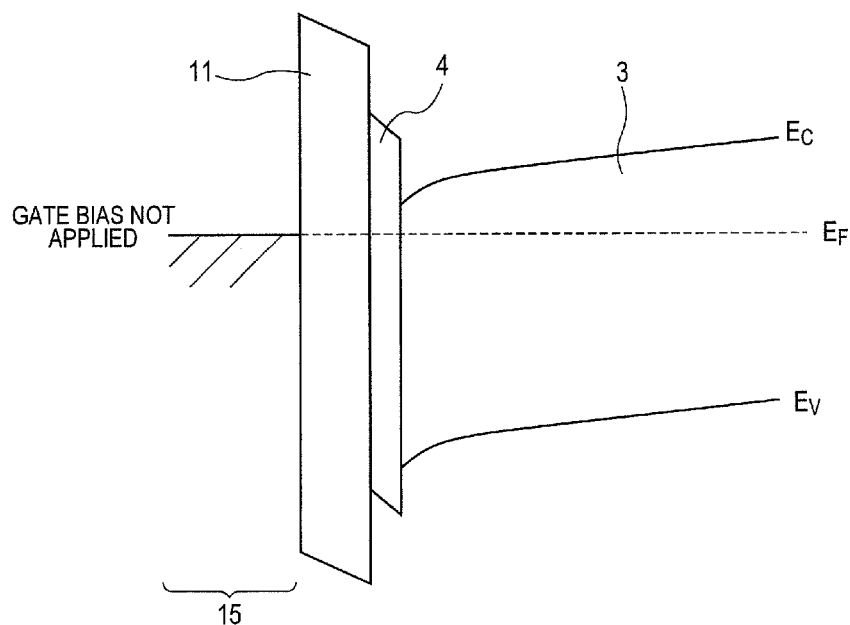
FIG. 3 is an explanatory view showing a band diagram below a first gate electrode 15 of the semiconductor device of the first embodiment of the invention.

FIG. 3 shows a band diagram of the first gate electrode 15 and the band diagram of the nitride semiconductor stack 10 below the gate electrode 15. When the bias is not applied to the first gate electrode 15 (0 V), a Fermi energy ($E_F$) of the system is lower than that of the conduction band ($E_c$) of the hetero-junction body comprising the nitride semiconductors 3, 4 and carriers at the hetero-interface are eliminated by the static potential of the first gate electrode 15 and the gate insulation film 11. Accordingly, the field effect transistor is in an off state and a normally off operation.

Figure 4:
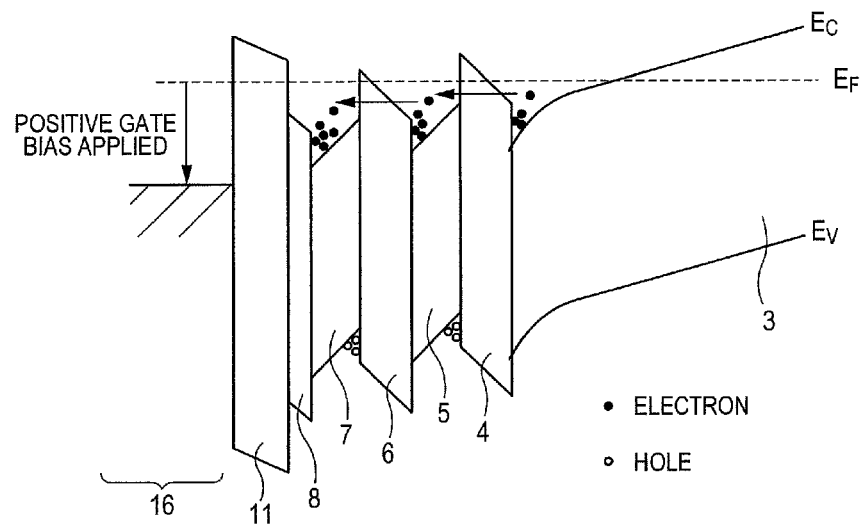
FIG. 4 is an explanatory view showing a band diagram below a second gate electrode 16 of the semiconductor device of the first embodiment of the invention.

On the other hand, when a positive bias (for example, +15 V) is applied to the first gate electrode 15, energy $E_F$ of the system is higher than the conduction band ($E_c$) of the hetero-junction body comprising the nitride semiconductors 3 and 4 and the two dimensional electron gas of high concentration is formed at the hetero-interface. Accordingly, the field effect transistor is turned to the on state. In this case, a positive bias (for example, +10 V) is applied also to the second gate electrode 16. FIG. 4 shows a band diagram of the second gate electrode 16 and the nitride semiconductor stack 10 below the second gate electrode 16. By the positive bias applied to the second gate electrode 16, $E_c$ on the side of the gate of the nitride semiconductor stack 10 is lower than $E_F$, and the two dimensional electron gases are formed to the hetero-interfaces of the three sets of the hetero-junction bodies comprising the nitride semiconductors 3 and 4, 5 and 6, and 7 and 8.

Further, also the height of the barrier of the nitride semiconductors 4 and 6 as the barrier to each of the two dimensional electron gases is also lower relative to the energy $E_F$, and the electrons can override the barrier due to the tunneling effect. Accordingly, in the on-state of the field effect transistor shown in FIG. 1, carriers more from the source electrode 13 by way of a region below the gate electrode 15, connect the plurality of channels (three sets in FIG. 1) and reach the drain electrode 14 through the three sets of the channels. That is, as the number of stacks of the hetero-junction bodies is larger, the amount of the generated two dimensional electron gases increases more and the on resistance of the field effect transistor, can be decreased.

The off breakdown voltage of the field effect transistor can be maintained constantly by the polarization effect as irrespective of the number of stacks of the hetero-junction bodies described in Japanese Unexamined Patent Application Publication No. 2007-234607. Further, since lines of electric field from the drain electrode 14 applied with the positive bias are terminated on both of the first gate electrode 15 and the second gate electrode 16, the second gate electrode 16 has a field moderating effect to the first gate electrode 15. That is, the off breakdown voltage can also be improved in this embodiment.

Second Embodiment

In the first embodiment, since two gate electrodes are provided, there is a merit that the bias can be applied and controlled independently on every gate electrodes. However, layout for the interconnection and the method of driving the field effect transistor become complicated. Then, an example of a semiconductor device simple in the manufacturing step, the layout, and the driving method is to be described in this embodiment.

Figure 5:
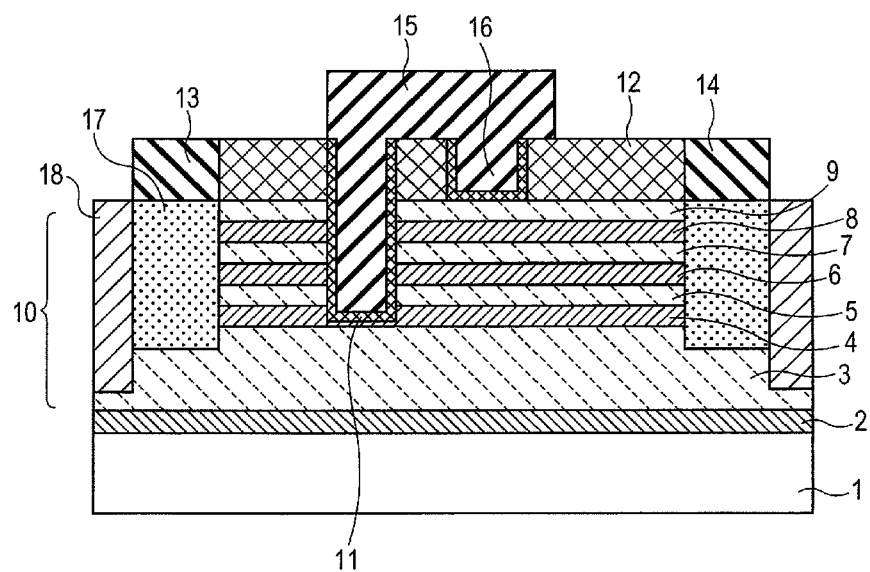
FIG. 5 is an explanatory view showing a cross sectional structure of a semiconductor device of a second embodiment of the invention.

FIG. 5 is an explanatory view showing a cross sectional structure of a semiconductor device in a second embodiment. Description is to be omitted for the portions having the same function as the configurations that carry the same references explained already in the first embodiment.

Different from the first embodiment, this embodiment has a feature that the, gate electrode 15 and the gate electrode 16 are formed integrally over the surface of the nitride semiconductor stack 10. Manufacturing steps are to be described successively.

A buffer layer 2 and a nitride semiconductor stack 10 are formed over a semiconductor substrate 1, and a device isolation region 18, an n-type region 17, a source electrode 13, and a drain electrode 14 are formed in the same manner as in the first embodiment.

Then, an insulation protective film 12 is deposited by a CVD method or a sputtering method. The insulation protective film 12 comprises, for example, a $SiO_2$ film, a SiN film, or a stacked film thereof of about 300 nm thickness.

Successively, a first gate region 15 and a second gate region 16 are patterned by photolithography and the insulation protective film 12 in the regions is fabricated by dry etching.

Further, only the first gate region 15 is patterned by photolithography and the nitride semiconductor stack 10 in the region is fabricated by dry etching. In this step, fabrication is preferably performed from the surface of the nitride semiconductor stack to the nitride semiconductor 4.

Then, the gate insulation film 11 described in the first embodiment 1 is deposited. Successively, the first gate electrode 15 and the second gate electrode 16 described in the first embodiment are formed by a CVD method or an ALD method. FIG. 5 shows an example of forming the second gate electrode 16 over the surface of the nitride semiconductor stack 10 but it may be formed inside the nitride semiconductor stack 10 as shown in FIG. 1. However, as has been described in the first embodiment, the hetero-junction may not remain below the first gate region and two or more sets of the hetero-junction bodies preferably remain below the second gate region.

Finally, not illustrated pad regions for applying a bias from the outside to the respective electrodes are apertured to complete the semiconductor device of this embodiment.

In this embodiment, since the first gate electrode 15 and the second gate electrode 16 can be formed simultaneously, the manufacturing step can be simplified. Further, since the first gate electrode 15 and the second gate electrode 16 are integrated, the layout for interconnection and the driving method of the field effect transistor can also be simplified.

Also in this embodiment, normally off operation and decrease in the on resistance can be attained in the same manner as in the first embodiment.

Third Embodiment

In the second embodiment, it is necessary to pattern and fabricate the first gate electrode region 15 by photolithography after patterning the insulation protective film 12 of the first and second gate electrode regions 15, 16.

In this embodiment, an example of a semiconductor device obtainable by more simple manufacturing steps is to be explained.

Figure 6:
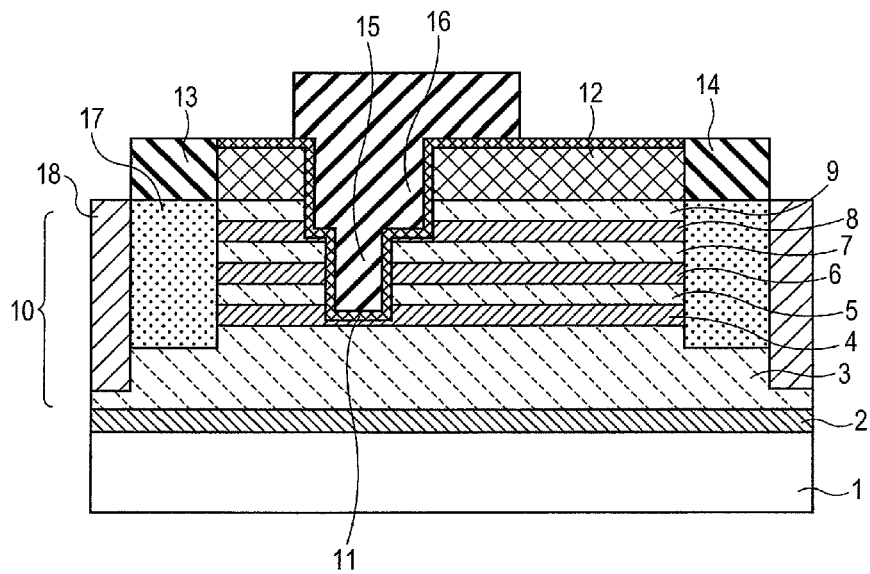
FIG. 6 is an explanatory view showing a cross sectional structure of a semiconductor device of a third embodiment of the invention.

FIG. 6 is an explanatory view showing a cross sectional structure of a semiconductor device in a third embodiment. Description is to be omitted for the portions having the same function as the configurations that carry the same references explained already in the first and second embodiments.

Different from the second embodiment, this embodiment has a feature that the gate electrode 15 and the gate electrode 16 are formed integrally in the nitride semiconductor stack 10. The manufacturing steps are to be described successively.

In the same manner as in the second embodiment, a buffer layer 2 and a nitride semiconductor stack 10 are formed over the semiconductor substrate 1, and a device isolation region 18, an n-type region 17, a source electrode 13, and a drain electrode 14 are formed.

Then, an insulation protective film 12 is deposited, for example, by a CVD method or a sputtering method. The insulation protective film 12 comprises, for example, a SiN film of about 300 nm thickness.

Figure 7:
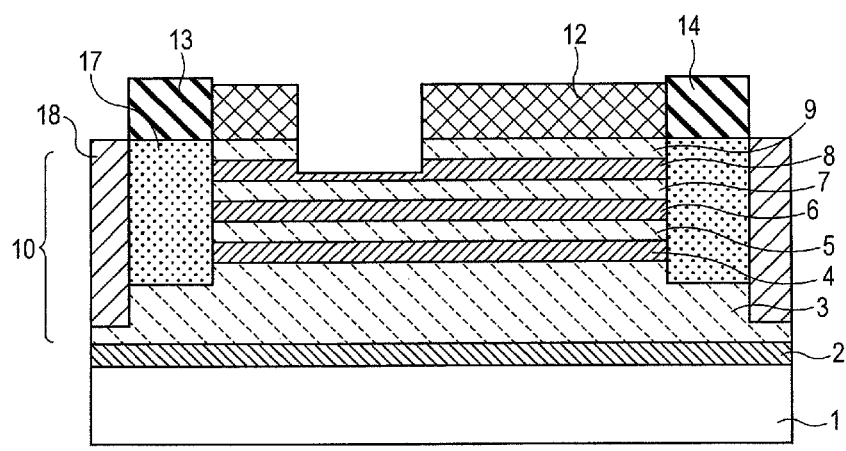
FIG. 7 is a cross sectional structural view showing a manufacturing step of the semiconductor device of the third embodiment of the invention.

Successively, a region corresponding to a second gate region 16 is patterned by photolithography, and the insulation protective film 12 in the region is fabricated by dry etching. Further, the nitride semiconductor stack 10 is fabricated by dry etching using the patterned insulation protective film 12 as a hard mask. FIG. 7 shows an example of fabrication from the surface of the nitride semiconductor stack 10 to the nitride semiconductor 8, but it may suffice that two or more sets of hetero-junction bodies remain below the fabrication region.

Figure 8:
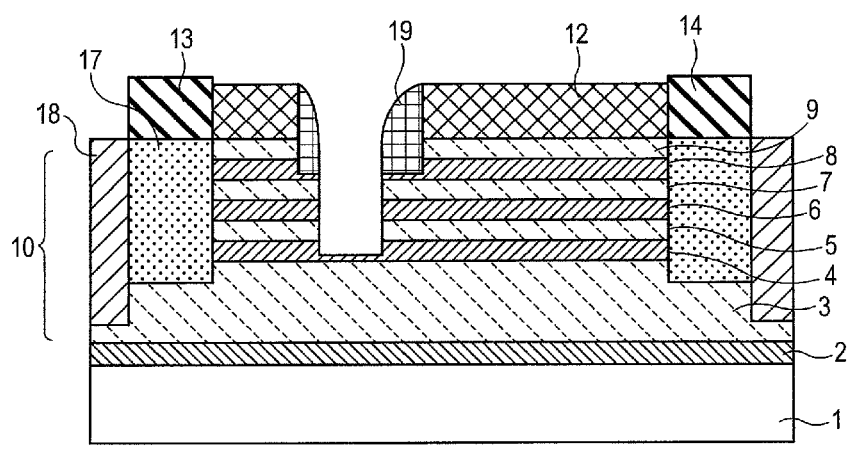
FIG. 8 is a cross sectional structural view showing a manufacturing step of the semiconductor device of the third embodiment of the invention.

Then, a $SiO_2$ film or the like of about 300 nm thickness is deposited by a CVD method or a sputtering method. Subsequently, a side wall 19 comprising a $SiO_2$ film is formed on the lateral wall of the openings of the protective insulation film 12 by etching back the $SiO_2$ film by dry etching. Successively, the nitride semiconductor stack 10 is fabricated by dry etching using the protective insulation film 12 and the side wall 19 as a hard mask (FIG. 8).

Further, only the side wall 19 can be removed by selective wet etching using, for example, hydrofluoric acid to obtain a nitride semiconductor stack 10 in which the gate region is fabricated stepwise.

Subsequently, in the same manner as in the second embodiment, a gate insulation film 11 is deposited and by way of a gate electrode formation, etc. the semiconductor device of this embodiment is completed. However, as described in the first embodiment, the hetero-junction body may not remain below the first gate region and two or more sets of hetero-junctions may preferably remain below the second gate region.

In this embodiment, different from the second embodiment, the first gate electrode region can be fabricated with no additional photolithography and the manufacturing step can be simplified. Further, in the on state of the field effect transistor of this embodiment, just after the passage of carriers below the first gate electrode 15, the carriers can be directly combined in the plurality of the hetero-junction bodies by the second gate electrode 16, and the on resistance can be decreased further.

Further, in the off state of the field effect transistor, since the electric field from the drain electrode 14 to the first and the second gate electrodes 15, 16 can be moderated by forming the gate electrode in a gangue-shape toward the drain electrode 14 as shown in FIG. 6, and the off breakdown voltage can also be improved.

Also in this embodiment, normally off operation and decrease in the on resistance can be attained in the same manner as in the first and second embodiments.

What is claimed is:

1. A semiconductor device comprising:
   a nitride semiconductor stack having at least one set of two hetero-junction bodies where a first nitride semiconductor layer and a second nitride semiconductor layer having a second band gap wider than a first band gap of the first nitride semiconductor layer are stacked;
   a drain electrode, a source electrode, and gate electrodes positioned between the drain electrode and the source electrode and disposed so as to oppose them, respectively,
   wherein the drain electrode and the source electrode are disposed along opposite sides of the nitride semiconductor stack,
   wherein the drain electrode and the source electrode are electrically connected to hetero-interfaces of the hetero-junction bodies, and
   wherein the gate electrodes include, a first gate electrode extending to a first depth in the nitride semiconductor stack and a second gate electrode extending to a second depth in the nitride semiconductor stack different from the first depth.

2. The semiconductor device according to claim 1, wherein the first gate electrode is disposed in an inside of the nitride semiconductor stack and one set or less of the hetero-junction bodies is disposed below the first gate electrode.

3. The semiconductor device according to claim 1, wherein the first gate electrode passes through at least one set of the hetero-junction bodies.

4. The semiconductor device according to claim 1, wherein the second gate electrode is disposed in an inside and over a surface of the nitride semiconductor stack, and two sets or more of the hetero-junction bodies are disposed below the second gate electrode.

5. The semiconductor device according to claim 1, wherein the first gate electrode and the second gate electrode comprise an electroconductive material disposed, by way of a gate insulative film, over a surface of the nitride semiconductor stack and in at least one trench formed in an inside of the nitride semiconductor stack.

6. The semiconductor device according to claim 1, wherein each of the first gate electrode and the second gate electrode have longitudinal ends disposed so as to extend in the inside and over a surface of the nitride semiconductor stack to an insulated device isolation region disposed along lateral sides of the nitride semiconductor stack in an inside and over the surface of the nitride semiconductor stack.

7. The semiconductor device according to claim 6, wherein the first gate electrode and the second electrode are disposed in the inside of the nitride semiconductor stack at a predetermined distance and integrated and connected electrically to each other over the surface of the nitride semiconductor stack.

8. The semiconductor device according to claim 6, wherein the first gate electrode and the second gate electrode are integrated and connected electrically to each other in the inside and over the surface of the nitride semiconductor stack.

9. The semiconductor device according to claim 1, wherein a set of the hetero-junction. bodies comprises GaN and $Al_xGa_{1-x}N$ (0<x≤1).

10. The semiconductor device according to claim 1, wherein
    a set of the hetero-junction bodies comprises GaN and $In_yAl_{1-y}N$ (0<y≤1).

11. The semiconductor device according to claim 2, wherein
    the second gate electrode is disposed in the inside and over a surface of the nitride semiconductor stack, and two sets or more of the hetero-junction bodies are disposed below the second gate electrode.

* * * * *